United States Patent
Abe (10) Patent No.: US 10,031,544 B2
(45) Date of Patent: Jul. 24, 2018

(54) POWER SUPPLY VOLTAGE DETECTION CIRCUIT, SEMICONDUCTOR INTEGRATED CIRCUIT DEVICE, AND ELECTRONIC DEVICE

(71) Applicant: SEIKO EPSON CORPORATION, Tokyo (JP)

(72) Inventor: Sachiyuki Abe, Hara-mura (JP)

(73) Assignee: SEIKO EPSON CORPORATION, Tokyo (JP)

( * ) Notice: Subject to any disclaimer, the term of this patent is extended or adjusted under 35 U.S.C. 154(b) by 138 days.

(21) Appl. No.: 15/172,932

(22) Filed: Jun. 3, 2016

(65) Prior Publication Data
US 2016/0378129 A1 Dec. 29, 2016

(30) Foreign Application Priority Data

Jun. 23, 2015 (JP) ................................. 2015-125406

(51) Int. Cl.
| H03K 5/153 | (2006.01) |
| G05F 3/02 | (2006.01) |
| H03K 5/24 | (2006.01) |
| H01L 27/02 | (2006.01) |

(52) U.S. Cl.
CPC ............... *G05F 3/02* (2013.01); *H03K 5/24* (2013.01); *H01L 27/0285* (2013.01)

(58) Field of Classification Search
CPC ........ H03K 5/2481; H03K 5/249; H03K 5/08; H03K 5/24; G01R 19/16519
USPC .................................................... 327/77, 78
See application file for complete search history.

(56) References Cited

U.S. PATENT DOCUMENTS

| 6,078,210 A * | 6/2000 | Uchida | .............. G01R 31/3004 |
| | | | 327/530 |
| 6,111,395 A * | 8/2000 | Hirade | .................... G05F 1/465 |
| | | | 323/273 |
| 6,650,173 B1 * | 11/2003 | Khouri | .................... G11C 5/147 |
| | | | 327/538 |

(Continued)

FOREIGN PATENT DOCUMENTS

| JP | H11-119870 A | 4/1999 |
| JP | 2998265 B2 | 1/2000 |
| JP | 5446770 B2 | 3/2014 |

*Primary Examiner* — Quan Tra
(74) *Attorney, Agent, or Firm* — Oliff PLC (57) ABSTRACT

A power supply voltage detection circuit can detect the power supply voltage obtained by stabilizing a power supply voltage supplied from outside and also the magnitude of the power supply voltage before being stabilized. This power supply voltage detection circuit includes a selection circuit that selects one power supply potential from among a plurality of power supply potentials including a first power supply potential supplied from outside and a second power supply potential obtained by stabilizing the first power supply potential, a variable voltage dividing circuit that divides the voltage between the power supply potential selected by the selection circuit and a reference potential by a set division ratio, a comparison voltage generation circuit that generates a comparison voltage based on a reference voltage, and a comparator that compares the voltage divided by the variable voltage dividing circuit with the comparison voltage and outputs a signal representing a comparison result.

9 Claims, 4 Drawing Sheets

(56) References Cited

U.S. PATENT DOCUMENTS

| | | | | |
|---|---|---|---|---|
| 7,804,284 | B1* | 9/2010 | Wong | G05F 1/46 |
| | | | | 323/269 |
| 8,058,910 | B1* | 11/2011 | Wright | G06F 1/24 |
| | | | | 327/142 |
| 2004/0263123 | A1* | 12/2004 | Breen | H02J 7/0022 |
| | | | | 320/128 |
| 2010/0066431 | A1* | 3/2010 | Carter | H02J 1/10 |
| | | | | 327/408 |
| 2011/0050670 | A1* | 3/2011 | Kim | G05F 1/46 |
| | | | | 345/211 |
| 2011/0121870 | A1 | 5/2011 | Morino | |
| 2012/0056666 | A1* | 3/2012 | Ryu, II | G01R 31/2884 |
| | | | | 327/538 |

\* cited by examiner

POWER SUPPLY VOLTAGE DETECTION CIRCUIT, SEMICONDUCTOR INTEGRATED CIRCUIT DEVICE, AND ELECTRONIC DEVICE

BACKGROUND

1. Technical Field

The present invention relates to a power supply voltage detection circuit for detecting the magnitude of a power supply voltage. Furthermore, the invention relates to a semiconductor integrated circuit device incorporating such a power supply voltage detection circuit, an electronic device using such a semiconductor integrated circuit device, and the like.

2. Related Art

For example, in an electronic device that operates with a power supply voltage supplied from a battery, the power supply voltage supplied from the battery is supplied to a number of circuit blocks after being stabilized by a regulator. Generally, power supply voltage detection circuits outputs a signal representing a comparison result, by comparing the power supply voltage that is output from the regulator with a predetermined voltage.

As related technology, JP-A-11-119870 (paras. 0005-0006; FIG. 1) discloses a power supply voltage detection circuit configured to enable a user to more reliably check when to replace the battery of a mobile electronic device than was previously possible. This power supply voltage detection circuit is provided with a first detection circuit for detecting a first voltage that is higher than a minimum voltage guaranteeing normal operation of the electronic device, a second detection circuit for detecting a second voltage between the first voltage and the minimum voltage, a first flag circuit that is set when the first detection circuit detects a state where the power supply voltage has dropped to the first voltage, a second flag circuit that is set when the second detection circuit detects a state where the power supply voltage has dropped to the second voltage, and an interrupt processing circuit to which the output of the first and second flag circuits is supplied and prioritizes execution of interrupt processing in accordance with the state of the first flag circuit over interrupt processing in accordance with the state of the second flag circuit, and the power supply voltage detection circuit output a signal for warning that the power supply voltage has dropped to near the minimum voltage, by performing interrupt processing in accordance with the state of the first flag circuit, when the power supply voltage drops to the first voltage.

The power supply voltage detection circuit of JP-A-11-119870 also conceivably detects the magnitude of the power supply voltage that is output from the regulator. However, in the case of wanting to know the remaining capacity of the battery in order to estimate when to replace or charge the battery, the remaining capacity of the battery can be more accurately known by detecting the magnitude of the power supply voltage that is supplied from the battery rather than by detecting the magnitude of the power supply voltage that is output from the regulator. Also, in the case of using an electronic switch in order to select one power supply potential from among a plurality of power supply potentials, inflow of current from nodes to which a power supply potential that has not been selected is supplied is a problem.

SUMMARY

An advantage of some aspects of the invention is to provide a power supply voltage detection circuit that can detect not only the power supply voltage that is obtained by stabilizing a power supply voltage supplied from outside but also the magnitude of the power supply voltage before being stabilized. Another advantage of some aspects of the invention is to provide a power supply voltage detection circuit that is able to prevent inflow of current from nodes to which a power supply potential that has not been selected is supplied, in a selection circuit that selects one power supply potential from among a plurality of power supply potentials. Yet another advantage of some aspects of the invention is to provide a semiconductor integrated circuit device that incorporates such a power supply voltage detection circuit and an electronic device or the like that uses such a semiconductor integrated circuit device.

In order to solve at least some of the above problems, a power supply voltage detection circuit according to one aspect of the invention includes a selection circuit that selects one power supply potential from among a plurality of power supply potentials including a first power supply potential supplied from outside and a second power supply potential obtained by stabilizing the first power supply potential, a variable voltage dividing circuit that divides a voltage between the power supply potential selected by the selected selection circuit and a reference potential by a set division ratio, a comparison voltage generation circuit that generates a comparison voltage based on the reference voltage, and a comparator that outputs a signal representing a comparison result, by comparing the voltage divided by the variable voltage dividing circuit with the comparison voltage.

According to the above aspect of the invention, by providing a selection circuit that selects one power supply potential from among a plurality of power supply potentials and a variable voltage dividing circuit that divides the voltage between the power supply potential selected by the selection circuit and a reference potential by a set division ratio, it becomes possible to detect not only a second power supply potential that is obtained by stabilizing a first power supply potential supplied from outside but also the first power supply potential before being stabilized. Accordingly, in the case where the power supply voltage is supplied from a battery, the remaining capacity of the battery can be accurately known by detecting the first power supply potential before being stabilized.

Here, the power supply voltage detection circuit may be configured such that the selection circuit includes a first P-channel MOS transistor provided on a first N-well electrically connected to a first node to which the first power supply potential is supplied, and connected between the first node and a second node, a second P-channel MOS transistor provided on a second N-well electrically connected to a third node, and connected between the second node and the third node, a third P-channel MOS transistor provided on a third N-well electrically connected to a fourth node to which the second power supply potential is supplied, and connected between the fourth node and a fifth node, and a fourth P-channel MOS transistor provided on the second N-well or a fourth N-well electrically connected to the third node, and connected between the fifth node and the third node, and the selection circuit selects one power supply potential from the first and second power supply potentials, and supplies the selected power supply potential to the third node as a third power supply potential.

Generally, when a P-channel MOS transistor to which a power supply potential is supplied is provided on an N-well electrically connected to the third node, current flows from the source of the P-channel MOS transistor to the third node via the N-well. On the other hand, according to the above configuration, the first or third N-well in which the first or third P-channel MOS transistor is provided is electrically separated from the second or fourth N-well electrically connected to the third node. In view of this, by applying the first or second power supply potential to the first or third N-well, inflow of current to the third node from a node to which a power supply potential that has not been selected is supplied can be prevented.

In this case, the power supply voltage detection circuit may be configured to further include a control signal generation circuit that operates in accordance with a selection signal representing which power supply potential to select from among the plurality of power supply potential, and applies, to a gate of the first P-channel MOS transistor, a control signal that is at a low level when selecting the first power supply potential and that is at the first power supply potential when not selecting the first power supply potential, applies, to a gate of the second P-channel MOS transistor, a control signal that is at a low level when selecting the first power supply potential and that is at the third power supply potential when not selecting the first power supply potential, applies, to a gate of the third P-channel MOS transistor, a control signal that is at a low level when selecting the second power supply potential and that is at the second power supply potential when not selecting the second power supply potential, and applies, to a gate of the fourth P-channel MOS transistor, a control signal that is at a low level when selecting the second power supply potential and that is at the third power supply potential when not selecting the second power supply potential.

Thereby, the first and second P-channel MOS transistors enter an OFF state when the first power supply potential is not selected, and the third and fourth P-channel MOS transistors enter an OFF state when the second power supply potential is not selected, enabling the selected power supply potential to be accurately detected.

in the above, the power supply voltage detection circuit may be configured such that the comparator has a first input terminal to which the comparison voltage is input, and a second input terminal to which the voltage divided by the variable voltage dividing circuit is input, the variable voltage dividing circuit includes a first resistor connected between wiring of the reference potential and the second input terminal of the comparator, a plurality of resistors connected in series to the second input terminal of the comparator, and a plurality of switch circuits that apply the power supply potential selected by the selection circuit to one terminal of one resistor among the plurality of resistors, in accordance with a setting signal representing which division ratio to set among a plurality of division ratios. In this way, by setting the division ratio according to the power supply potential that is selected by the selection circuit, the range of the selected power supply potential can be grasped.

A semiconductor integrated circuit device according to one aspect of the invention includes a regulator that outputs a second power supply potential by stabilizing a first power supply potential supplied from outside, and any of the above power supply voltage detection circuits. Thereby, not only the second power supply potential that is obtained by stabilizing the first power supply potential supplied from the outside but also the first power supply potential before being stabilized can be detected inside the semiconductor integrated circuit device.

An electronic device according to one aspect of the invention is provided with the above semiconductor integrated circuit device. The power supply voltage detection circuit incorporated in the semiconductor integrated circuit device is able to grasp the magnitude of the power supply voltage that is supplied to other portions of an electronic device, by detecting the first power supply potential before being stabilized by a regulator. Accordingly, in the case where the power supply voltage is supplied from a battery, it becomes possible to judge whether the remaining capacity of the battery is sufficient in order for the electronic device to operate normally.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
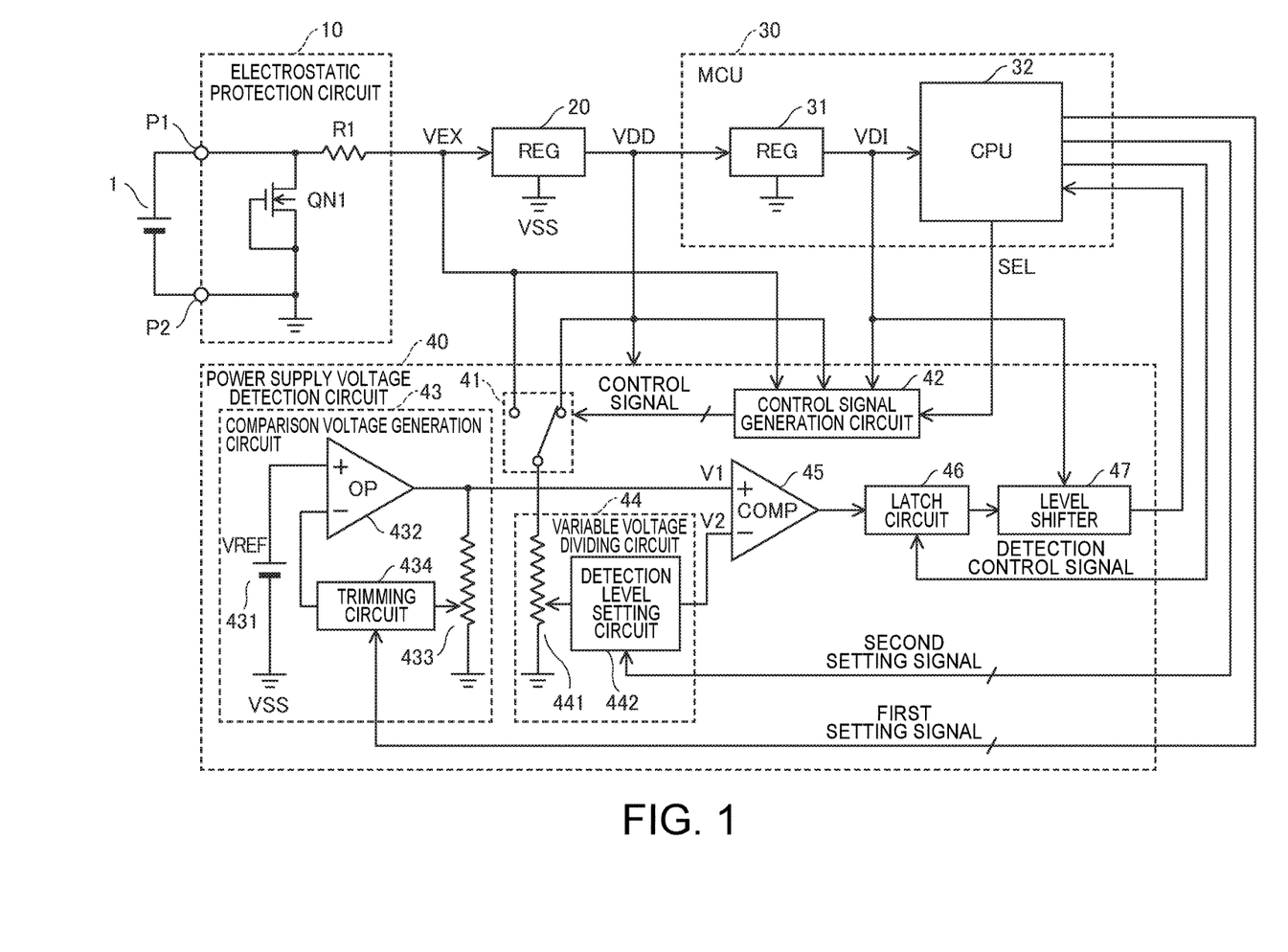
FIG. 1 shows an exemplary configuration of a semiconductor integrated circuit device incorporating a power supply voltage detection circuit.

Hereinafter, embodiments of the invention will be described in detail, with reference to the drawings. Note that the same reference signs are given to constituent elements that are the same, and redundant description will be omitted.
Semiconductor Integrated Circuit Device FIG. 1 shows an exemplary configuration of a semiconductor integrated circuit device incorporating a power supply voltage detection circuit according to one embodiment of the invention. This semiconductor integrated circuit device is used in an electronic device that operates with a power supply voltage supplied from a battery 1, for example. As shown in FIG. 1, the semiconductor integrated circuit device includes an electrostatic protection circuit 10, a regulator (REG) 20, a microcomputer (MCU) 30, and a power supply voltage detection circuit 40.

The electrostatic protection circuit 10 includes an N-channel MOS transistor QN1 and a resistor R1. A drain of the transistor QN1 is connected to a power supply terminal P1, and a gate and a source are connected to a power supply terminal P2. When the static electricity that is greater than or equal to a predetermined voltage is applied between the power supply terminal P1 and the power supply terminal P2 when the battery 1 is not connected to the power supply terminals P1 and P2, the transistor QN1 enters an conductive state, and the voltage between the power supply terminal P1 and the power supply terminal P2 is reduced. Also, the resistor R1 reduces current that flows to internal circuits of the semiconductor integrated circuit device through application of static electricity.

The regulator 20 outputs a stabilized power supply potential VDD (e.g., 2V), by stabilizing a power supply potential VEX (e.g., 5V) that is supplied from the battery 1 with respect to a reference potential VSS (e.g., 0V). The power supply potential VDD that is output from the regulator 20 is supplied to a number of circuit blocks within the semiconductor integrated circuit device.

The microcomputer 30 includes a regulator (REG) 31 and a CPU (Central Processing Unit) 32. The regulator 31 outputs a stabilized power supply potential VDI (e.g., 1.4V), by stabilizing the power supply potential VDD that is supplied from the regulator 20 with respect to the reference potential VSS. The power supply potential VDI that is output from the regulator 31 is supplied to the CPU 32 and the like. The CPU 32 controls each circuit block within the semiconductor integrated circuit device.

Power Supply Voltage Detection Circuit

The power supply voltage detection circuit 40 includes a selection circuit 41, a control signal generation circuit 42, a comparison voltage generation circuit 43, a variable voltage dividing circuit 44, a comparator 45, a latch circuit 46, and a level shifter 47.

The selection circuit 41 selects one power supply potential from among a plurality of power supply potentials including a first power supply potential that is supplied from outside and a second power supply potential that is obtained by stabilizing the first power supply potential. Hereinafter, the case where the selection circuit 41 selects one power supply potential from among the power supply potential VEX that is supplied from the battery 1 and the power supply potential VDD that is supplied from the regulator 20 will be described as an example.

The CPU 32 outputs a selection signal SEL representing which power supply potential to select from among a plurality of power supply potentials to the control signal generation circuit 42. In this example, the selection signal SEL is a signal representing which power supply potential to select from among the power supply potential VEX and the power supply potential VDD. The control signal generation circuit 42 operates in accordance with the selection signal SEL, and generates a plurality of control signals for controlling the selection circuit 41.

The comparison voltage generation circuit 43 generates a comparison voltage V1 based on a reference voltage VREF. For example, the comparison voltage generation circuit 43 includes a constant voltage generation circuit 431, an operational amplifier 432, a ladder resistor 433, and a trimming circuit 434.

The constant voltage generation circuit 431 includes a depletion-type transistor and an enhancement-type transistor, for example, and generates the reference voltage VREF. The temperature characteristics of the reference voltage VREF can be flattened, by balancing the temperature characteristics of the depreciation-type transistor and the temperature characteristics of the enhancement-type transistor.

The reference voltage VREF is input to a non-inverting input terminal of the operational amplifier 432. The ladder resistor 433 and the trimming circuit 434 are connected between an output terminal and an inverting input terminal of the operational amplifier 432. The output voltage of the operational amplifier 432 is divided by the ladder resistor 433. The CPU 32 outputs a first setting signal for setting a division ratio of the ladder resistor 433 to the trimming circuit 434.

The trimming circuit 434 includes a plurality of switch circuits (transistors, etc.) connected between a plurality of nodes of the ladder resistor 433 and the inverting input terminal of the operational amplifier 432, for example. One of these switch circuits enters an ON state in accordance with the first setting signal that is output from the CPU 32. Thereby, the voltage of the selected node of the ladder resistor 433 is input to the inverting input terminal of the operational amplifier 432. The operational amplifier 432 outputs a comparison voltage V1 from the output terminal, such that the voltage that is input to the inverting input terminal equals the reference voltage VREF. The comparison voltage V1 is input to a first input terminal of the comparator 45.

The variable voltage dividing circuit 44 divides the voltage between the power supply potential selected by the selection circuit 41 and the reference potential VSS by the set division ratio to generate a divided voltage V2. For example, the variable voltage dividing circuit 44 includes a ladder resistor 441 and a detection level setting circuit 442.

The voltage between the power supply potential selected by the selected selection circuit 41 and the reference potential VSS is divided by the ladder resistor 441. The CPU 32 outputs a second setting signal for setting the division ratio in the ladder resistor 441 to the detection level setting circuit 442, in correspondence with the power supply potential selected by the selection circuit 41.

The detection level setting circuit 442 includes a plurality of switch circuits (transistors, etc.) connected between the plurality of nodes of the ladder resistor 441 and a second input terminal of the comparator 45, for example, and one of these switch circuits enters an ON state in accordance with the second setting signal that is output from the CPU 32. Thereby, the voltage V2 of the selected node of the ladder resistor 441 is input to the second input terminal of the comparator 45.

The comparator 45 has the first input terminal to which the comparison voltage V1 is input and the second input terminal to which the voltage V2 divided by the variable voltage dividing circuit 44 is input. The comparator 45 outputs a signal representing a comparison result, by comparing the voltage V2 divided by the variable voltage dividing circuit 44 with the comparison voltage V1.

For example, if the voltage V2 divided by the variable voltage dividing circuit 44 is larger than the comparison voltage V1, the output signal of the comparator 45 will be at a low level. On the other hand, if the voltage V2 divided by the variable voltage dividing circuit 44 is smaller than the comparison voltage V1, the output signal of the comparator 45 will be at a high level.

The latch circuit 46 latches the output signal of the comparator 45 at the timing at which the detection control signal that is output from the CPU 32 is activated. The level shifter 47 is supplied the power supply potential VDI from the MCU 30. The level shifter 47 shifts the high level of the output signal of the latch circuit 46 according to the power supply potential VDI to generate an output signal. The output signal of the level shifter 47 is supplied to the CPU 32.

Figure 2:
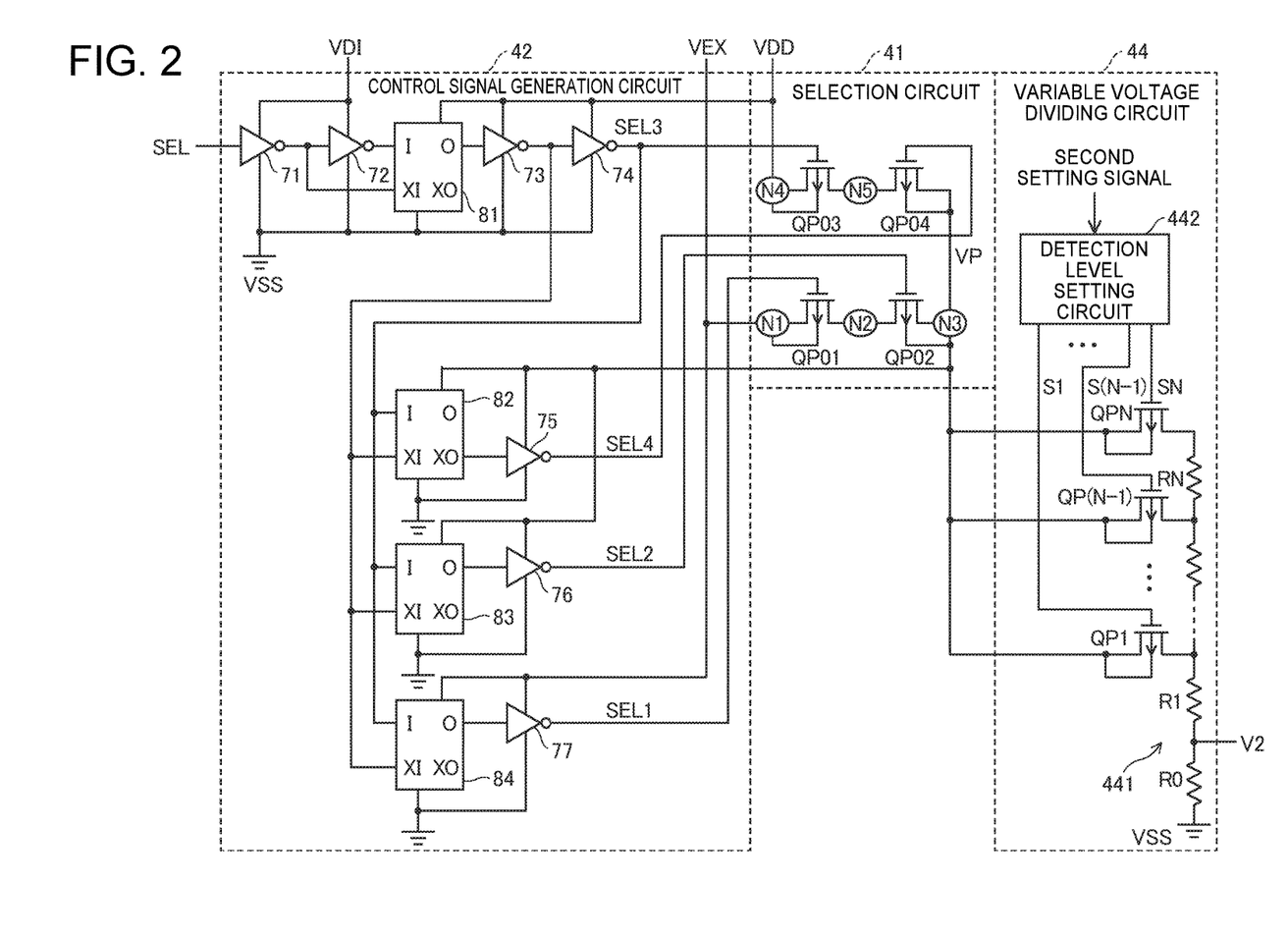
FIG. 2 is a circuit diagram showing a specific example of the power supply voltage detection circuit shown in FIG. 1.

FIG. 2 is a circuit diagram showing a specific example of the power supply voltage detection circuit shown in FIG. 1. The selection circuit 41, the control signal generation circuit 42 and the variable voltage dividing circuit 44 are shown in FIG. 2.

Selection Circuit

The selection circuit 41 includes P-channel MOS transistors QP01 to QP04, and functions to select one power supply potential from among the power supply potential VEX that is supplied to a node N1 and the power supply potential VDD that is supplied to a node N4, and supply the selected power supply potential to a node N3 as a power supply potential VP.

The transistor QP01 is connected between the node N1 to which the power supply potential VEX is supplied and a node N2. The transistor QP02 is connected between the node N2 and the node N3. The transistor QP03 is connected between the node N4 to which the power supply potential VDD is supplied and a node N5. The transistor QP04 is connected between the node N5 and the node N3.

Figure 3A:
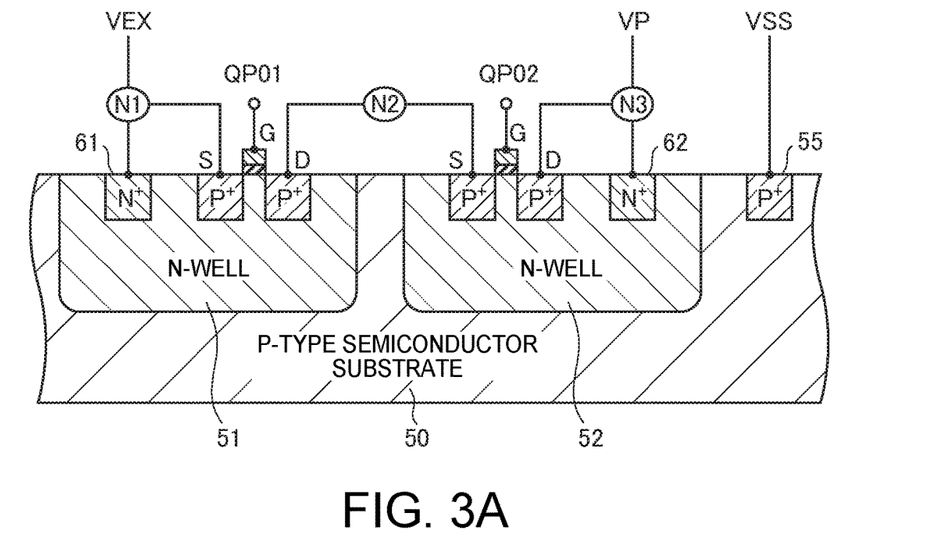
FIGS. 3A and 3B are cross-sectional views showing a semiconductor substrate provided with transistors of a selection circuit shown in FIG. 2.
Figure 3B:
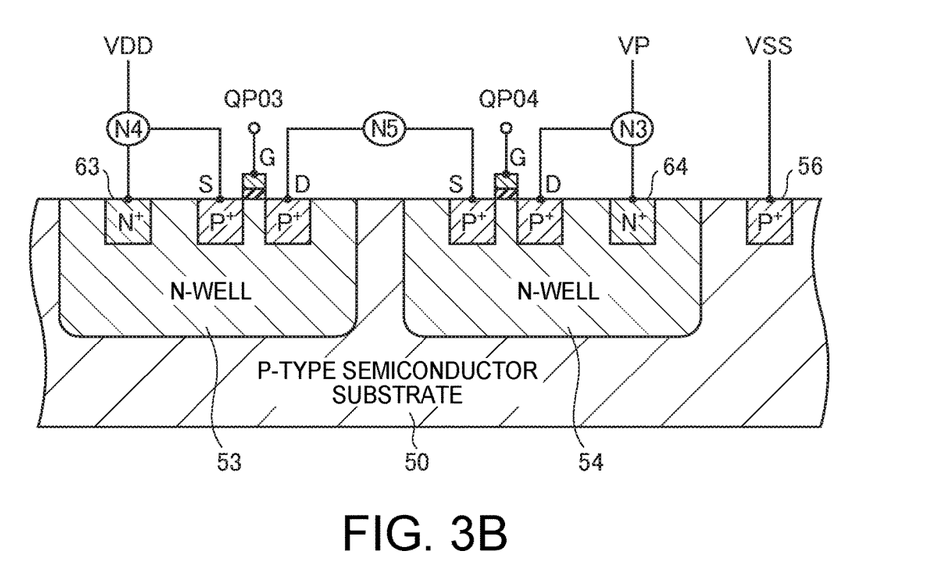

FIGS. 3A and 3B are cross-sectional views showing a semiconductor substrate provided with the transistors of the selection circuit shown in FIG. 2. As shown in FIGS. 3A and 3B, N-wells 51 to 54 are formed within a P-type semiconductor substrate 50. Note that the N-well 52 may be used instead of the N-well 54. Also, P-type impurity diffusion regions 55 and 56 are formed within the semiconductor substrate 50, in order to apply the reference potential VSS to the semiconductor substrate 50.

FIG. 3A shows the region where the transistors QP01 and QP02 are provided. The transistor QP01 is provided on the N-well 51 electrically connected to the node N1 to which the power supply potential VEX is supplied. That is, P-type impurity diffusion regions that serve as a source S and a drain D of the transistor QP01 are formed within the N-well 51, and a gate electrode G of the transistor QP01 is provided on the N-well 51 via a gate insulating film. The N-well 51 is the equivalent of a back gate of the transistor QP01, and an N-type impurity diffusion region 61 is formed within the N-well 51 in order to apply a potential to the N-well 51. The source and the back gate of the transistor QP01 are connected to the node N1, and the power supply potential VEX is supplied thereto. The drain of the transistor QP01 is connected to the node N2.

Also, the transistor QP02 is provided on the N-well 52 electrically connected to the node N3. That is, P-type impurity diffusion regions that serve as a source S and a drain D of the transistor QP02 are formed within the N-well 52, and a gate electrode G of the transistor QP02 is provided on the N-well 52 via a gate insulating film. The N-well 52 is the equivalent of a back gate of the transistor QP02, and an N-type impurity diffusion region 62 is formed within the N-well 52 in order to apply a potential to the N-well 52. The source of the transistor QP02 is connected to the node N2. The drain and the back gate of the transistor QP02 are connected to the node N3.

In the case of selecting the power supply potential VEX that is supplied to the node N1, a low-level potential (e.g., reference potential VSS) is applied to the gate of the transistor QP01 and the gate of the transistor QP02, thus resulting in the transistors QP01 and QP02 entering an ON state, and the power supply potential VEX is thus supplied to the node N3. On the other hand, in the case of not selecting the power supply potential VEX, the transistor QP01 is placed in an OFF state by applying a high-level potential (e.g., power supply potential VEX) to the gate of the transistor QP01, and the transistor QP02 is placed in an OFF state by applying a high-level potential (e.g., power supply potential VP) to the gate of the transistor QP02.

Generally, when a P-channel MOS transistor to which a power supply potential is supplied is provided on an N-well electrically connected to the node N3, current flows from the source of the P-channel MOS transistor to the node N3 via the N-well. On the other hand, according to the configuration shown in FIG. 3A, the N-well 51 on which the transistor QP01 is provided is electrically separated from the N-well 52 electrically connected to the node N3. In view of this, by applying the power supply potential VEX to the N-well 51, inflow of current from the node N1 to which the power supply potential VEX is supplied to the node N3 can be prevented, in the case of not selecting the power supply potential VEX.

FIG. 3B shows the region where the transistors QP03 and QP04 are provided. The transistor QP03 is provided on the N-well 53 electrically connected to the node N4 to which the power supply potential VDD is supplied. That is, P-type impurity diffusion regions that serve as a source S and a drain D of the transistor QP03 are formed within the N-well 53, and a gate electrode G of the transistor QP03 is provided on the N-well 53 via a gate insulating film. The N-well 53 is the equivalent of a back gate of the transistor QP03, and an N-type impurity diffusion region 63 is formed within the N-well 53 in order to apply a potential to the N-well 53. The source and the back gate of the transistor QP03 are connected to the node N4, and the power supply potential VDD is supplied thereto. The drain of the transistor QP03 is connected to the node N5.

Also, the transistor QP04 is provided on the N-well 54 electrically connected to the node N3. That is, a P-type impurity diffusion regions that serve as a source S and a drain D of the transistor QP04 are formed within the N-well 54, and a gate electrode G of the transistor QP04 is provided on the N-well 54 via a gate insulating film. The N-well 54 is the equivalent of a back gate of the transistor QP04, and an N-type impurity diffusion region 64 is formed within the N-well 54 in order to apply a potential to the N-well 54. The source of the transistor QP04 is connected to the node N5. The drain and the back gate of the transistor QP04 are connected to the node N3.

In the case of selecting the power supply potential VDD that is supplied to the node N4, applying a low-level potential (e.g., reference potential VSS) to the gate of the transistor QP03 and the gate of the transistor QP04 results in the transistors QP03 and QP04 entering an ON state, and the power supply potential VDD is thus supplied to the node N3. On the other hand, in the case of not selecting the power supply potential VDD, the transistor QP03 is placed in an OFF state by applying a high-level potential (e.g., power supply potential VDD) to the gate of the transistor QP03, and the transistor QP04 is placed in an OFF state by applying a high-level potential (e.g., power supply potential VP) to the gate of the transistor QP04.

According to the configuration shown in FIG. 3B, the N-well 53 on which the transistor QP03 is provided is electrically separated from the N-well 54 electrically connected to the node N3. In view of this, by applying the power supply potential VDD to the N-well 53, inflow of current from the node N4 to which the power supply potential VDD is supplied to the node N3 can be prevented, in the case of not selecting the power supply potential VDD.

Control Signal Generation Circuit

Referring again to FIG. 2, the control signal generation circuit 42 includes inverters 71 to 77 and level shifters 81 to 84. The inverters 71 and 72 operate with the power supply potential VDI supplied from the MCU 30 (FIG. 1), and buffer the selection signal SEL that is output from the CPU 32 (FIG. 1) to generate an output signal. The selection signal SEL is at a high level (power supply potential VDI) when selecting the power supply potential VEX, and is at a low level (reference potential VSS) when selecting the power supply potential VDD.

The level shifter 81 shifts the high level of the output signal of the inverter 72 according to the power supply potential VDD to generate an output signal. The inverter 73 inverts the output signal of the level shifter 81 to generate an output signal. The inverter 74 inverts the output signal of the inverter 73 to generate a control signal SEL3. The control signal SEL3 is at a low level (reference potential VSS) when selecting the power supply potential VDD, and is at a high level (power supply potential VDD) when not selecting the power supply potential VDD.

The level shifter 82 shifts the high level of the control signal SEL3 that is output from the inverter 74 according to the power supply potential VP and inverts the shifted control signal to generate an inverted output signal. The inverter 75 further inverts the inverted output signal of the level shifter 82 to generate a control signal SEL4. The control signal SEL4 is at a low level (reference potential VSS) when selecting the power supply potential VDD, and is at a high level (power supply potential VP) when not selecting the power supply potential VDD.

The level shifter 83 shifts the high level of the control signal SEL3 that is output from the inverter 74 according to the power supply potential VP to generate an output signal. The inverter 76 inverts the output signal of the level shifter 83 to generate a control signal SEL2. The control signal SEL2 is at a low level (reference potential VSS) when selecting the power supply potential VEX, and is at a high level (power supply potential VP) when not selecting the power supply potential VEX.

The level shifter 84 shifts the high level of the control signal SEL3 that is output from the inverter 74 according to the power supply potential VEX to generate an output signal. The inverter 77 inverts the output signal of the level shifter 84 to generate a control signal SEL1. The control signal SEL1 is at a low level (reference potential VSS) when selecting the power supply potential VEX, and is at a high level (power supply potential VEX) when not selecting the power supply potential VEX.

The control signal generation circuit 42 applies the control signal SEL1 to the gate of the transistor QP01, applies the control signal SEL2 to the gate of the transistor QP02, applies the control signal SEL3 to the gate of the transistor QP03, and applies the control signal SEL4 to the gate of the transistor QP04.

When the selection signal SEL is at a high level, the control signals SEL1 and SEL2 are at a low level. Thereby, the transistors QP01 and QP02 enter an ON state and supply the power supply potential VEX to the node N3. Also, the control signal SEL3 is at the power supply potential VDD, and the control signal SEL4 is at the power supply potential VP. Thereby, the transistors QP03 and QP04 enter an OFF state when not selecting the power supply potential VDD, enabling the selected power supply potential VEX to be accurately detected.

On the other hand, when the selection signal SEL is at a low level, the control signals SEL3 and SEL4 are at a low level. Thereby, the transistors QP03 and QP04 enter an ON state and supply the power supply potential VDD to the node N3. Also, the control signal SEL1 is at the power supply potential VEX, and the control signal SEL2 is at the power supply potential VP. Thereby, the transistors QP01 and QP02 enter an OFF state when not selecting the power supply potential VEX, enabling the selected power supply potential VDD to be accurately detected.

Variable Voltage Dividing Circuit

The variable voltage dividing circuit 44 includes resistors R0 to RN constituting the ladder resistor 441, a plurality of switch circuits that are constituted by P-channel MOS transistors QP1 to QPN, for example, and the detection level setting circuit 442. The detection level setting circuit 442 generates the setting signals S1 to SN representing which division ratio to set among a plurality of division ratios, based on the second setting signal that is output from the CPU 32 (FIG. 1). For example, the detection level setting circuit 442 is able to set 16 division ratios, in order to detect power supply potentials of 1.2V to 5V.

The resistor R0 is connected between wiring of the reference potential VSS and the second input terminal of the comparator 45 (FIG. 1). The resistors R1 to RN are connected in series to the second input terminal of the comparator 45. The plurality of switch circuits apply the power supply potential selected by the selected selection circuit 41 to one terminal of one resistor among the plurality of resistors R1 to RN, in accordance with the setting signals S1 to SN.

For example, the CPU 32 shown in FIG. 1 outputs the first setting signal for setting the comparison voltage V1 to 1V to the comparison voltage generation circuit 43, and outputs the second setting signal for setting the division ratio such that the divided voltage V2 will be around 1V to the variable voltage dividing circuit 44. That is, the CPU 32 outputs the second setting signal for setting the division ratio as 5:1 to the detection level setting circuit 442, in the case where the power supply potential VEX having a rated value of 5V is selected.

The detection level setting circuit 442 sets the setting signals S1 to S(N−1) to a high level and sets the setting signal SN to a low level, in accordance with the second setting signal. Accordingly, the transistors QP1 to QP(N−1) are turned off and the transistor QPN is turned on to apply the power supply potential VEX to one terminal of the resistor RN. The resistors R0 to RN divide the voltage between the power supply potential VEX and the reference potential VSS by the division ratio 5:1 to generate a voltage V2 of around 1V. The comparator 45 outputs a signal representing a comparison result, by comparing the voltage V2 with the comparison voltage V1.

Thereby, the CPU 32 is able to grasp whether the power supply potential VEX is higher than the rated value 5V. Also, in the case where the power supply potential VEX is lower than the rated value 5V, the CPU 32 can be configured to grasp whether the power supply potential VEX is higher than 4.8V, by changing the division ratio. This enables the CPU 32 to grasp the range of the power supply potential VEX.

Similarly, the CPU 32 supplies the second setting signal for setting the division ratio as 2:1 to the detection level setting circuit 442, in the case where the power supply potential VDD having a rated value of 2V is selected. Thereby, the CPU 32 is able to grasp whether the power supply potential VDD is higher than the rated value 2V. In this way, the range of the selected power supply potential can be grasped, by setting the division ratio according to the power supply potential that is selected by the selection circuit 41.

As described above, according to this embodiment, by providing the selection circuit 41 that selects one power supply potential from among a plurality of the power supply potentials and the variable voltage dividing circuit 44 that divides the voltage between the power supply potential selected by the selected selection circuit 41 and the reference potential VSS by the set division ratio, it becomes possible to detect not only the power supply potential VDD that is obtained by stabilizing the power supply potential VEX supplied from outside but also the power supply potential VEX before being stabilized. Accordingly, in the case where the power supply voltage is supplied from a battery, the remaining capacity of the battery can be accurately known by detecting the power supply potential VEX before being stabilized.

Electronic Device

Next, an electronic device according to one embodiment of the invention will be described, with reference to FIG. 4.

Figure 4:
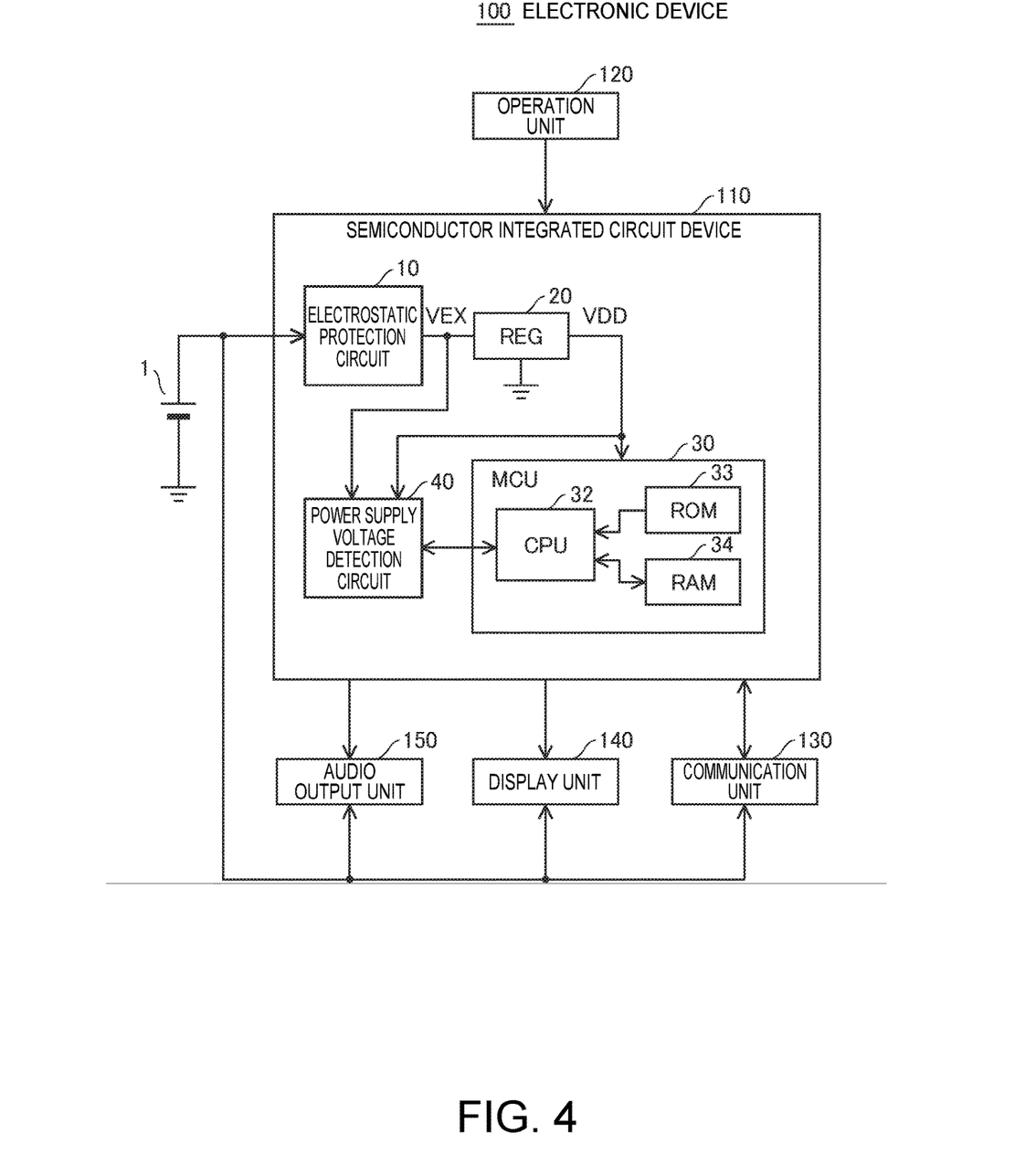
FIG. 4 is a block diagram showing an exemplary configuration of an electronic device according to one embodiment of the invention.

FIG. 4 is a block diagram showing an exemplary configuration of an electronic device according to one embodiment of the invention. An electronic device 100 may include a semiconductor integrated circuit device 110 according to one embodiment of the invention, an operation unit 120, a communication unit 130, a display unit 140, and an audio output unit 150. For example, the semiconductor integrated circuit device 110 and constituent elements from the communication unit 130 to the audio output unit 150 operate with a power supply voltage supplied from the battery 1. Note that some of the constituent elements shown in FIG. 4 may be omitted or changed or other constituent elements may be added to the constituent elements shown in FIG. 4.

The semiconductor integrated circuit device 110 includes the electrostatic protection circuit 10, the regulator (REG) 20, the microcomputer (MCU) 30, and the power supply voltage detection circuit 40. Also, the microcomputer 30 includes the regulator 31 (FIG. 1), the CPU 32, and a ROM (Read-Only Memory) 33 and a RAM (Random Access Memory) 34.

The CPU 32 performs various types of computational processing and control processing using data and the like that is stored in the ROM 33 and the like, in accordance with programs stored in the ROM 33 and the like. For example, the CPU 32 performs various types of data processing according to operation signals output from the operation unit 120, controls the communication unit 130 in order to perform data communication externally, generates image signals for displaying various types of images on the display unit 140, and generates audio signals for outputting various types of audio from the audio output unit 150.

The ROM 33 stores programs, data and the like for the CPU 32 to perform various types of computational processing and control processing. Also, the RAM 34 is used as a work area of the CPU 32, and temporarily stores programs and data read from the ROM 33, data input using the operation unit 120, or the results of computation executed by the CPU 32 in accordance with the programs.

The operation unit 120 is an input device including operation keys, button switches or the like, and outputs operation signals that depend on operations by a user to the CPU 32, for example. The communication unit 130 is constituted by analog circuits and digital circuits, for example, and performs data communication between the CPU 32 and external devices. The display unit 140 includes an LCD (liquid crystal display) or the like, for example, and displays various types of information based on display signals that are supplied from the CPU 32. Also, the audio output unit 150 includes a speaker or the like, for example, and outputs audio based on audio signals that are supplied from the CPU 32.

Devices that qualify as the electronic device 100 include, for example, a calculator, an electronic dictionary, an electronic game machine, a mobile terminal such as a mobile phone, a digital still camera, a digital movie camera, a television, a videophone, a security television monitor, a head-mounted display, a personal computer, a printer, a network device, a car navigation device, a measurement device, and medical equipment (e.g., electronic thermometer, sphygmomanometer, glucometer, electrocardiographic apparatus, ultrasound diagnostic equipment, and electronic endoscope).

In the present embodiment, the power supply voltage detection circuit 40 incorporated in the semiconductor integrated circuit device 110 is able to grasp the magnitude of the power supply voltage that is supplied to other portions of the electronic device, by detecting the power supply potential VEX before being stabilized by the regulator 20. Accordingly, in the case where the power supply voltage is supplied from the battery 1, it becomes possible to judge whether the remaining capacity of the battery 1 is sufficient in order for the electronic device 100 to operate normally.

The invention is not limited to the foregoing embodiment, and numerous modifications can be made within the technical idea of the invention, by a person having ordinary skill in the art.

The entire disclosure of Japanese Patent Application No. 2015-125406, filed Jun. 23, 2015 is expressly incorporated by reference herein.

What is claimed is:

1. A power supply voltage detection circuit comprising:
a selection circuit that selects one power supply potential from among a plurality of power supply potentials including a first power supply potential supplied from outside and a second power supply potential obtained by stabilizing the first power supply potential;
a variable voltage dividing circuit that divides a voltage between the power supply potential selected by the selection circuit and a reference potential by a set division ratio that is selected to correspond to the selected power supply potential;
a comparison voltage generation circuit that generates a comparison voltage based on the reference voltage; and
a comparator that outputs a signal representing a comparison result, by comparing the voltage divided by the variable voltage dividing circuit with the comparison voltage.

2. The power supply voltage detection circuit according to claim 1,
wherein the selection circuit includes:
a first P-channel MOS transistor provided on a first N-well electrically connected to a first node to which the first power supply potential is supplied, and connected between the first node and a second node;
a second P-channel MOS transistor provided on a second N-well electrically connected to a third node, and connected between the second node and the third node;
a third P-channel MOS transistor provided on a third N-well electrically connected to a fourth node to which the second power supply potential is supplied, and connected between the fourth node and a fifth node; and
a fourth P-channel MOS transistor provided on the second N-well or a fourth N-well electrically connected to the third node, and connected between the fifth node and the third node, and
the selection circuit selects one power supply potential from the first and second power supply potentials, and supplies the selected power supply potential to the third node as a third power supply potential.

3. The power supply voltage detection circuit according to claim 2, further comprising:
a control signal generation circuit that operates in accordance with a selection signal representing which power supply potential to select from among the plurality of power supply potential, and applies, to a gate of the first P-channel MOS transistor, a control signal that is at a low level when selecting the first power supply potential and that is at the first power supply potential when not selecting the first power supply potential, applies, to a gate of the second P-channel MOS transistor, a control signal that is at a low level when selecting the first power supply potential and that is at the third power supply potential when not selecting the first power supply potential, applies, to a gate of the third P-channel MOS transistor, a control signal that is at a low level when selecting the second power supply potential and that is at the second power supply potential when not selecting the second power supply potential, and applies, to a gate of the fourth P-channel MOS transistor, a control signal that is at a low level when selecting the second power supply potential and that is at the third power supply potential when not selecting the second power supply potential.

4. The power supply voltage detection circuit according to claim 1,
wherein the comparator has:
a first input terminal to which the comparison voltage is input; and
a second input terminal to which the voltage divided by the variable voltage dividing circuit is input, and
the variable voltage dividing circuit includes:
a first resistor connected between wiring of the reference potential and the second input terminal of the comparator;
a plurality of resistors connected in series to the second input terminal of the comparator; and
a plurality of switch circuits that apply the power supply potential selected by the selection circuit to one terminal of one resistor among the plurality of resistors, in accordance with a setting signal representing which division ratio to set among a plurality of division ratios.

5. A semiconductor integrated circuit device comprising:
a regulator that outputs a second power supply potential by stabilizing a first power supply potential supplied from outside; and
power supply voltage detection circuit according to claim 1.

6. A semiconductor integrated circuit device comprising:
a regulator that outputs a second power supply potential by stabilizing a first power supply potential supplied from outside; and
power supply voltage detection circuit according to claim 2.

7. A semiconductor integrated circuit device comprising:
a regulator that outputs a second power supply potential by stabilizing a first power supply potential supplied from outside; and
power supply voltage detection circuit according to claim 3.

8. A semiconductor integrated circuit device comprising:
a regulator that outputs a second power supply potential by stabilizing a first power supply potential supplied from outside; and
power supply voltage detection circuit according to claim 4.

9. An electronic device comprising the semiconductor integrated circuit device according to claim 5.

* * * * *